United States Patent [19]
Aoyama et al.

[11] Patent Number: 4,581,549
[45] Date of Patent: Apr. 8, 1986

[54] CMIS CHIP-SELECT CIRCUIT

[75] Inventors: Keizo Aoyama, Yamato; Takahiko Yamauchi; Teruo Seki, both of Kawasaki, all of Japan

[73] Assignee: Fujitsu Limited, Kawasaki, Japan

[21] Appl. No.: 535,833

[22] Filed: Sep. 26, 1983

[30] Foreign Application Priority Data

Sep. 28, 1982 [JP] Japan ................. 57-167511

[51] Int. Cl.$^4$ ................. H03K 17/693; H03K 19/096
[52] U.S. Cl. ..................... 307/452; 307/269; 307/469; 307/481; 365/229
[58] Field of Search ............... 307/269, 451, 452, 468, 307/469, 480, 481, 475; 365/228, 229, 233

[56] References Cited

U.S. PATENT DOCUMENTS 4,337,525 6/1982 Akatsuka .................. 365/233

Primary Examiner—Stanley D. Miller
Assistant Examiner—D. R. Hudspeth
Attorney, Agent, or Firm—Staas & Halsey

[57] ABSTRACT

A CMIS circuit device such as an IC chip in a semiconductor memory device, is made selectable by using at least two chip-select signals having opposite polarities. The CMIS circuit device has a chip-select control circuit for establishing a chip-selected state or a chip-unselected state upon receiving the abovementioned chip-select signals. The chip-select control circuit includes a CMIS inverter circuit which inverts one of the chip-select signals, and a CMIS logic gate circuit which receives an output signal from the CMIS inverter circuit and the other chip select signal or signals and outputs an internal chip-select control signal. The CMIS inverter circuit includes a CMIS inverter and one or more control transistors which receive the other chip-select signal or signals at the gates thereof and which are inserted in series between a power terminal of the CMIS inverter and a power source.

13 Claims, 11 Drawing Figures

| $\overline{CS_1}$ | $CS_2$ | POINT a POTENTIAL ($V_a$) | IV1 CURRENT ($I_1$) | POINT b POTENTIAL ($V_b$) | IV2 CURRENT ($I_2$) | CHIP SELECTION STATE |
|---|---|---|---|---|---|---|
| L | H | L | = 0 | H | = 0 | SELECTED |
| $V_{IL}$ | H | L | = 0 | H | ≠ 0 | SELECTED |
| L | $V_{IH}$ | L | ≠ 0 | H | = 0 | SELECTED |
| $V_{IL}$ | $V_{IH}$ | L | ≠ 0 | H | ≠ 0 | SELECTED |

Fig. 8B

| $\overline{CS_1}$ | $CS_2$ | POINT a POTENTIAL ($V_a$) | IV1 CURRENT ($I_1$) | POINT b POTENTIAL ($V_b$) | IV2 CURRENT ($I_2$) | CHIP SELECTION STATE |
|---|---|---|---|---|---|---|
| L | L | H | = 0 | L | = 0 | UNSELECTED |
| $V_{IL}$ | L | H | = 0 | L | = 0 | UNSELECTED |
| L | $V_{IL}$ | H | ≠ 0 | L | = 0 | |
| $V_{IL}$ | $V_{IL}$ | H | ≠ 0 | L | = 0 | |
| H | H | L | = 0 | L | = 0 | UNSELECTED |
| $V_{IH}$ | H | L | = 0 | L | ≠ 0 | |
| H | $V_{IH}$ | L | = 0 | L | = 0 | UNSELECTED |
| $V_{IH}$ | $V_{IH}$ | L | ≠ 0 | L | ≠ 0 | |
| H | L | FLOAT | = 0 | L | = 0 | UNSELECTED |
| $V_{IH}$ | L | H | = 0 | L | = 0 | UNSELECTED |
| H | $V_{IL}$ | L | = 0 | L | = 0 | UNSELECTED |
| $V_{IH}$ | $V_{IL}$ | INTMED | ≠ 0 | L | ≠ 0 | |

CMIS CHIP-SELECT CIRCUIT

BACKGROUND OF THE INVENTION (1) Field of the Invention

The present invention relates to a complementary metal-insulator semiconductor (CMIS) circuit device and in particular to a CMIS circuit device comprising an integrated circuit (IC) chip which is selected by two chip-select signals having opposite polarities and which has a battery backup condition that can be established by either of the two chip-select signals.

(2) Description of the Prior Art

In many cases, a plurality of IC chips of semiconductor memories and so on are used in one system, such as a computer, for the purpose of increasing the memory capacity. In such a system, a desired IC chip is selected from the plurality of IC chips for data reading or writing by a chip-select signal. In such a system, it is desirable to cause the IC chips not selected by the chip-select signal, i.e., the unselected chips, to assume a battery backup condition in which no current flows from the power source.

In a conventional CMIS circuit device, it is possible to select the IC chip and to cause the circuit device to assume a battery backup condition by using one chip-select signal or by using two chip-select signals having the same polarity. There is also known a CMIS circuit device in which an IC chip is selected by using two chip-select signals having opposite polarities. However, in the latter conventional CMIS circuit device, it is impossible to select an IC chip by independently using either of the two chip-select signals having opposite polarities.

SUMMARY OF THE INVENTION

In order to solve the above-mentioned problems of the conventional devices, the present invention utilizes the concept of inserting at least one series-connected transistor between a power source and the power terminal of an inverter, which inverts one chip-select signal, and controlling the series-connected transistor with another chip-select signal.

It is an object of the present invention to make it possible, in a CMIS circuit device, to obtain a condition in which a circuit current does not flow at all, thereby realizing a complete battery backup condition in an IC chip which assumes an unselected state when either one of two chip-select signals, having opposite polarities, are approximately equal to the power supply voltage, whichever voltage signifies the unselected state for that chip-select signal, or the ground voltage.

According to the present invention, there is provided a CMIS circuit device which is made selectable by using at least two chip-select signals having opposite polarities. The CMIS circuit device has a chip-select control circuit for establishing a chip-selected state and a chip-unselected state upon receiving the above-mentioned chip-select signals. The chip-select control circuit includes a CMIS inverter circuit for inverting one of the chip-select signals and a CMIS logic gate circuit for receiving an output signal form the CMIS inverter circuit and the other chip-select signal or signals and for outputting an internal chip-select control signal. The CMIS inverter circuit includes a CMIS inverter and one or more control transistors which receive the other chip-select signal or signals at their gates and which are inserted in series between a power terminal of the CMIS inverter and a power source.

DESCRIPTION OF THE PREFERRED EMBODIMENTS

Figures 1, 2:
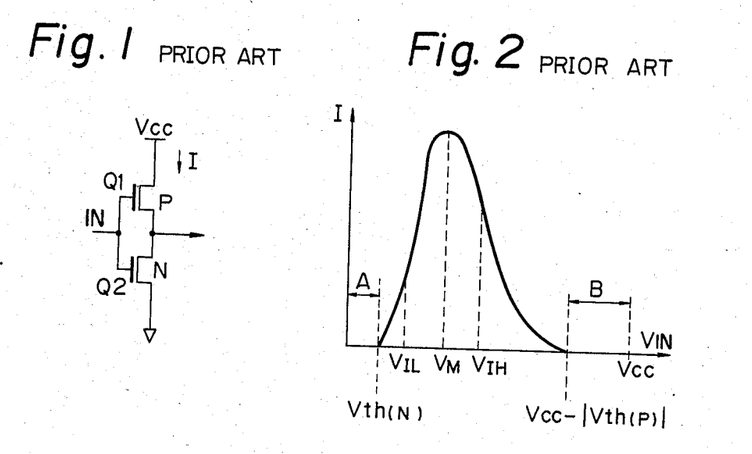
FIG. 1 is an electrical circuit diagram of a typical CMIS inverter.
FIG. 2 is a graph illustrating the voltage-current characteristics of the circuit of FIG. 1.

Before describing the preferred embodiments, some conventional CMIS circuit devices are explained with reference to the drawings. FIG. 1 shows a typical CMIS inverter circuit. The circuit of FIG. 1 is composed of a P-channel metal-insulator semiconductor (MIS) transistor Q1 and an N-channel MIS transistor Q2 which are serially connected between a power source $V_{CC}$, having, for example, a positive voltage, and ground. Assuming that the threshold voltage of the transistor Q2 is $V_{th}(N)$ and that threshold voltage of the transistor Q1 is $V_{th}(P)$, a direct current flows through the circuit provided that the level $V_{IN}$ of an input signal IN falls within a range represented as $V_{th}(N) \leq V_{IN} \leq V_{CC} - |V_{th}|$. If the level $V_{IN}$ of the input signal IN falls within a range A extending from 0 to $V_{th}(N)$, illustrated in FIG. 2, the transistor Q1 is in an ON state and the transistor Q2 is in a completely OFF state. As a result, the current I becomes zero. As the level of $V_{IN}$ is gradually increased from $V_{th}(N)$, the transistor Q2 gradually assumes an ON state so that the current I gradually begins to flow and then gradually increases. When the level $V_{IN}$ reaches a certain intermediate value $V_M$, the current I reaches a peak value because both transistors Q1 and Q2 exhibit a comparatively low-resistance state. As the level $V_{IN}$ is further increased from the intermediate value $V_M$, the N-channel transistor Q2 is completely saturated whereas the P-channel transistor Q1 gradually assumes a non-conductive state. As a result, the current I flowing through the inverter circuit is gradually decreased. If the level $V_{IN}$ falls within a range B, illustrated in FIG. 2, starting from $V_{CC} - |V_{th}(P)|$, the P-channel transistor Q1 is completely turned off so that the current I becomes zero.

In general, an input level of a CMIS integrated circuit device is prescribed in a technical specification as a minimum value $V_{IH}$ of the high-level voltage and a maximum value $V_{IL}$ of the low-level voltage. In an ordinary CMIS integrated circuit device wherein the power source voltage $V_{CC}$ is 5 volts, $V_{IH}$ is 2.0 to 2.4 volts and $V_{IL}$ is approximately 0.8 volts. Such a CMIS integrated circuit device must operate as if a low-level voltage is applied thereto when the input voltage does not exceed $V_{IL}$ and as if a high-level voltage is applied thereto when the input voltage is not lower than $V_{IH}$. As is apparent from FIG. 2, the voltages $V_{IL}$ and $V_{IH}$ thus prescribed exist within a range in which a direct current I shown in FIG. 1 flows. If such a CMIS integrated circuit device is to assume a battery backup condition, I=0, the input voltage must be set at a voltage near 0 volts or $V_{CC}$. However, an integrated circuit device usually has a number of input terminals. In order to place on type of conventional integrated circuit device having multiple input terminals in a battery backup condition, all of the multiple input terminals must have a voltage near 0 volts or $V_{CC}$.

Figure 3:
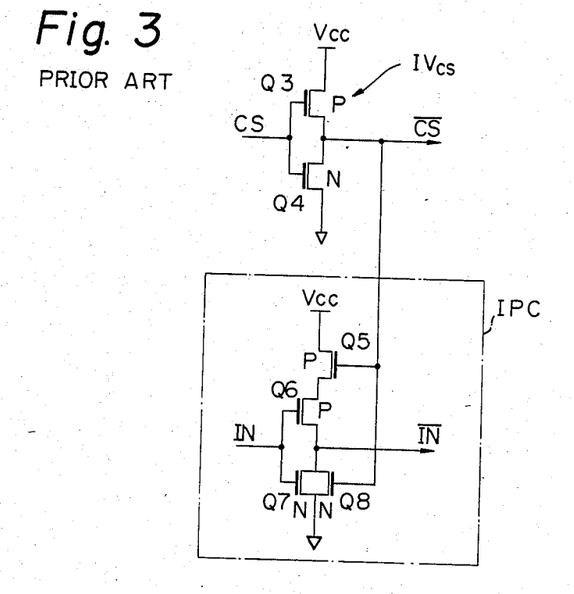
FIGS. 3 to 6 are partial electrical circuit diagrams illustrating conventional CMIS circuit devices.

FIG. 3 illustrates part of another conventional integrated circuit device in which the drawback of the above-mentioned conventional device has been removed. In the integrated circuit device illustrated in FIG. 3, one or more input circuits IPC which receive an input signal IN, such as an address signal or data signal, are controlled by a CMIS inverter for chip selection $IV_{CS}$ which is composed of a P-channel transistor Q3 and an N-channel transistor Q4. The input circuit or circuits IPC are composed of a P-channel transistor Q5 which forms a power supply means, a P-channel transistor Q6, and a parallel circuit consisting of an N-channel transistor Q7 and an N-channel transistor Q8, all of which are serially connected between the power source $V_{CC}$ and ground. The input signal IN is applied to the gates of the transistors Q6 and Q7. An output signal $\overline{IN}$ is derived from the point where the transistor Q6 and the parallel circuit of transistors Q7 and Q8 are coupled and is supplied to a circuit within the integrated circuit device. The gates of the transistors Q5 and Q8 are connected to the output of the inverter circuit for chip selection $IV_{CS}$ which outputs the signal $\overline{CS}$.

If the chip-select signal CS, which is input to the inverter for chip selection $IV_{CS}$ in the configuration of FIG. 3, is at 0 volts, the inverted chip-select signal $\overline{CS}$ assumes a level which is approximately $V_{CC}$. Accordingly, the transistor Q5 in the input circuit IPC is turned off and the transistor Q8 is turned on. Therefore, no matter what state the input signal IN may assume, the inverted input signal $\overline{IN}$ will be 0 volts. In this case, no direct current flows through any circuit. Even in a multiple-input integrated circuit device, it is possible to attain a battery backup condition by using the circuit illustrated in FIG. 3 and by setting the chip-select signal CS at 0 volts.

Figure 4:
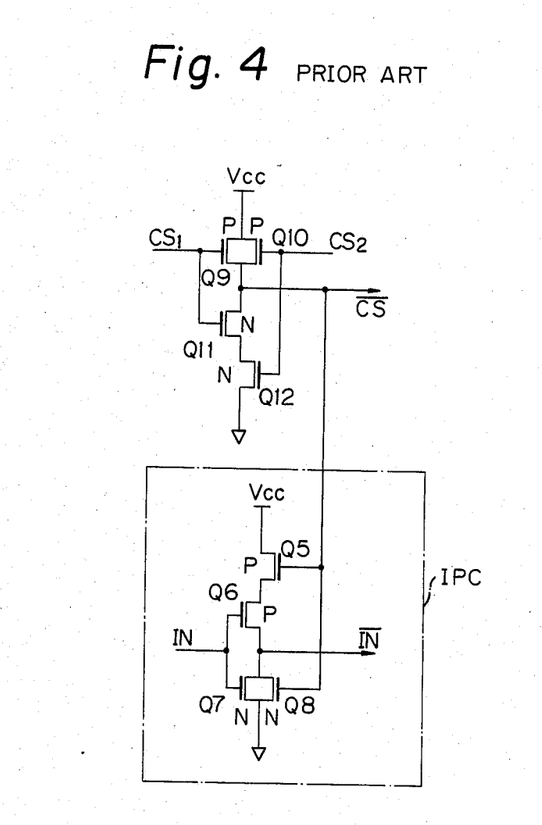

On the other hand, when a plurality of memory chips are used in a system such as a computer, it is advantageous for each IC chip to have two chip-select inputs to be used for attaining a battery backup condition in each IC chip. FIG. 4 illustrates part of an integrated circuit device on, an IC chip which can be selected by using two chip-select signals $CS_1$ and $CS_2$. In the circuit illustrated in FIG. 4, a chip-select inverter comprises a parallel circuit consisting of P-channel transistors Q9 and Q10, an N-channel transistor Q11, and an N-channel transistor Q12, all of which are connected in series between the power source $V_{CC}$ and ground. The first chip-select signal $CS_1$ is applied to the gates of the transistor Q9 and the transistor Q11 and the second chip select signal $CS_2$ is applied to the gates of the transistors Q10 and Q12. The inverted internal chip-select signal $\overline{CS}$ for controlling the input circuit IPC, which is the same as the circuit illustrated in FIG. 3, is derived from the point where the parallel circuit consisting of transistors Q9 and Q10 is connected to the transistor Q11. In the circuit illustrated in FIG. 4, it is possible to pull up the inverted chip-select signal $\overline{CS}$ to $V_{CC}$ if at least one of the two chip-select signals $CS_1$ and $CS_2$ is at 0 volts, thereby attaining a battery backup condition.

Figure 5:
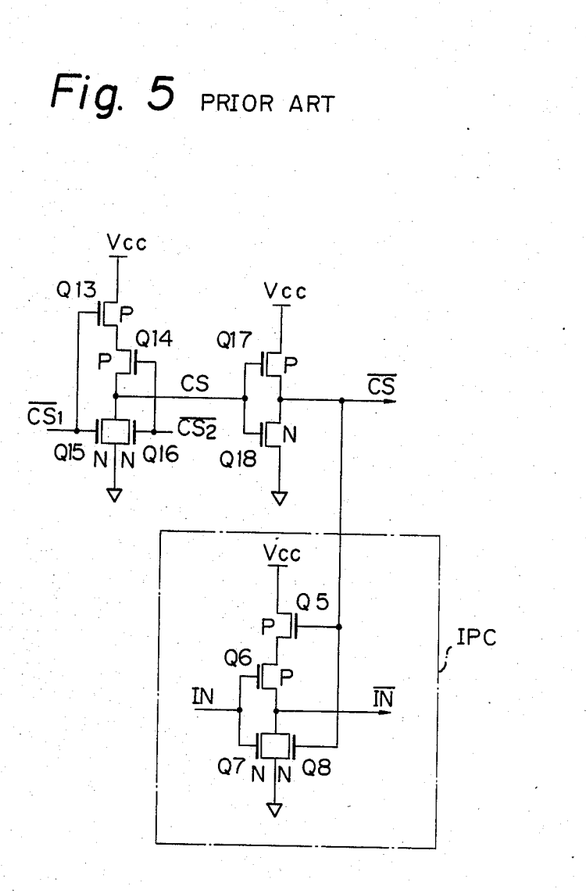

FIG. 5 shows part of the configuration of an integrated circuit device on an IC chip which can be selected by using two inverted select signals $\overline{CS}_1$ and $\overline{CS}_2$. The circuit illustrated in FIG. 5 is equipped with a first inverter, which consists of a P-channel transistor Q13, a P-channel transistor Q14, and a parallel circuit consisting of N-channel transistors Q15 and Q16 connected in series, and a second inverter which receives the output of the first inverter and consists of a P-channel transistor Q17 and an N-channel transistor Q18. From the output terminal of the second inverter, an inverted internal chip-select signal $\overline{CS}$ is output to control the input circuit IPC, which is the same as the circuit illustrated in FIG. 3. In this circuit, a battery backup condition can be established if at least one of the two inverted chip-select signals $\overline{CS}_1$ and $\overline{CS}_2$ is at a level near the power source voltage $V_{CC}$.

Figure 6:
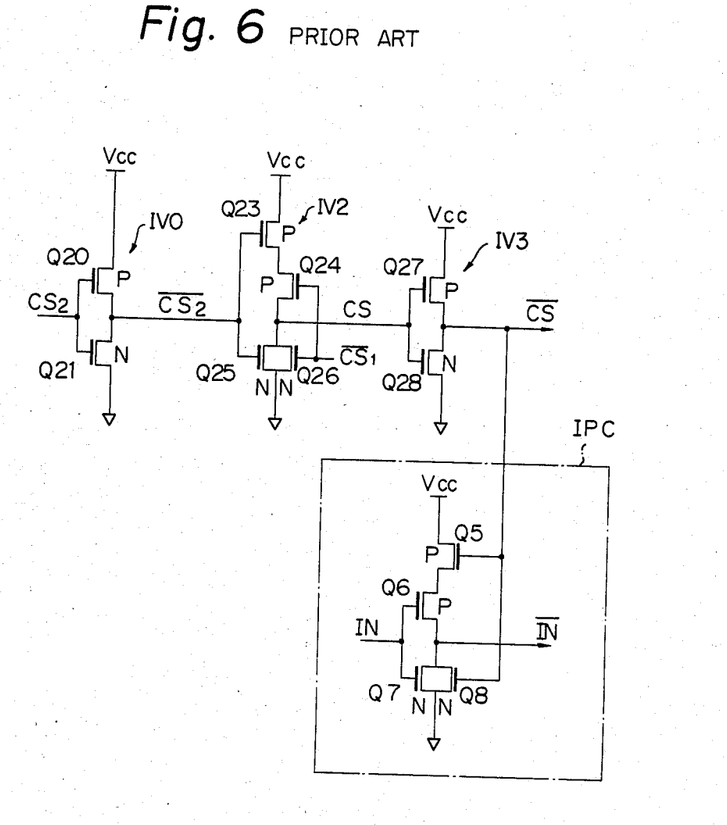

In the integrated circuit devices illustrated in FIG. 4 and FIG. 5, the two chip-select signals must have an identical polarity. Recently, it has been desired, in an integrated circuit device to which two chip-select signals having opposite polarities are applied, that a battery backup condition be attained by arbitrarily using one of the two chip-select signals. Accordingly, a circuit configuration as illustrated in FIG. 6 has been proposed. The circuit illustrated in FIG. 6 is equipped with a first inverter $IV_0$ consisting of a P-channel transistor Q20 and an N-channel transistor Q21, a second inverter $IV_2$ consisting of P-channel transistors Q23 and Q24 and a parallel circuit consisting of two N-channel transistors Q25 and Q26, and a third inverter $IV_3$ consisting of a P-channel transistor Q27 and an N-channel transistor Q28. An inverted chip-select signal $\overline{CS}$ for controlling the input circuit IPC, which is the same as the circuit illustrated in FIG. 3, is generated at the output of the third inverter $IV_3$. A chip-select signals $\overline{CS}_1$ is applied to the gates of transistors Q24 and Q26 of the second inverter $IV_2$, and a chip-select signal $CS_2$ is applied to the gates of transistors Q20 and Q21 of the first inverter $IV_0$.

In the circuit illustrated in FIG. 6, the input circuit IPC can be activated and caused to assume a chip-selected state by causing the chip-select signals $\overline{CS}_1$ to assume a low level and the chip-select signal $CS_2$ to assume a high level so that the inverted chip-select signal $\overline{CS}$ assumes a low level. If the chip-select signal $\overline{CS}_1$ is caused to assume a high level or the chip-select signal $CS_2$ is caused to assume a low level, the inverted chip-select signal $\overline{CS}$ is caused to assume a high level and the input circuit IPC is put in an inactive state. In the inactive state, the inverted input signal $\overline{IN}$ is always at a low level, and the chip-unselected state is attained.

When the chip-select signal $CS_2$ in the circuit of FIG. 6 is caused to assume a low level which is near the level of ground, the inverted chip-select signal $\overline{CS}$ will be caused to assume a high level near the level of the power source voltage $V_{CC}$. As a result, the current flowing through the input circuit IPC will be decreased to zero. In this case, the N-channel transistor Q21 is turned off in the first inverter $IV_0$. In the second inverter $IV_2$, the P-channel transistor Q23 is turned off and N-charms transistor Q25 is turned on irrespective of the state of the chip-select signal $\overline{CS}_1$. In the third inverter, $IV_3$, the N-channel transistor Q28 is turned off. Therefore, no current flows through any inverter, and a battery backup condition may be completely attained by controlling only the chip-select signal $CS_2$ of the two chip-select signals $\overline{CS}_1$ and $CS_2$.

In attempting to attain a battery backup condition by setting the chip-select signal $\overline{CS}_1$ at a high level near the power source voltage $V_{CC}$, the circuit illustrated in FIG. 6 has a drawback in that the chip-select signal $CS_2$ must be set at a level near the level of in ground in order to completely reduce to zero the current flowing through the first inverter $IV_0$. That is, if the chip-select signal $\overline{CS}_1$ is at $V_{CC}$ and the chip-select signal $CS_2$ is at $V_{IL}$, for example, the N-channel transistor Q21 in the first inverter does not completely turn off. Therefore, a direct current flows through the transistors Q20 and Q21. Accordingly, the circuit illustrated in FIG. 6 has a drawback in that it is impossible to attain a battery backup condition by controlling either one of the two chip-select signals $\overline{CS}_1$ and $CS_2$ having opposite polarities. According to the present invention, there is provided a CMIS circuit device which overcomes the above-mentioned problems of the prior art.

Figure 7:
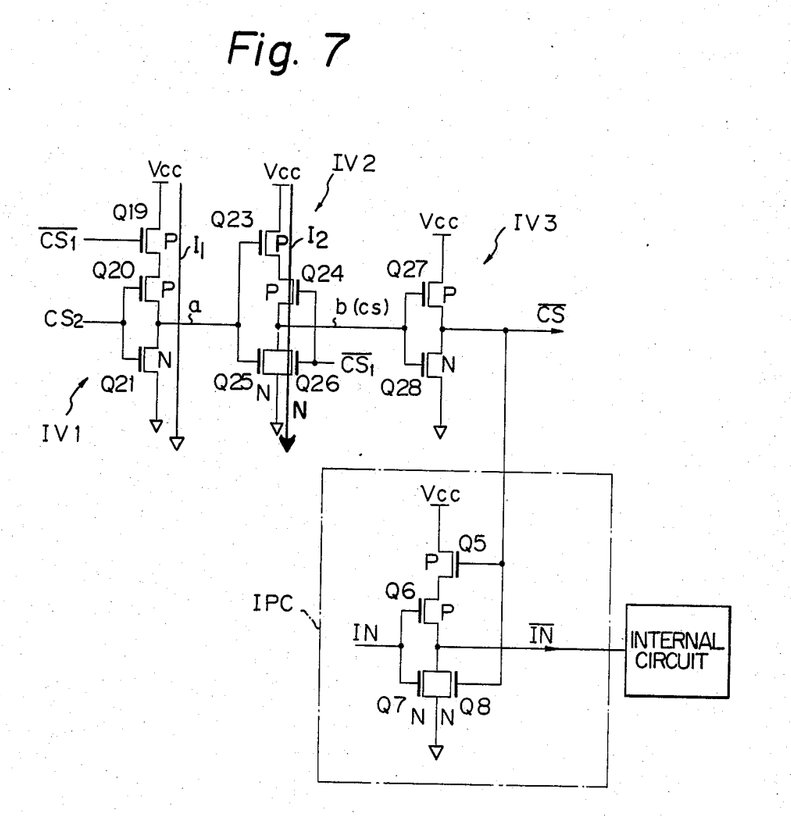
FIG. 7 is a partial electrical circuit diagram illustrating the configuration of an embodiment of a CMIS circuit device according to the present invention.

The embodiments of the present invention are now described with reference to the drawings. FIG. 7 is a diagram of part of a CMIS circuit device which is an embodiment of the present invention. The circuit of FIG. 7 includes a chip-select control circuit for supplying an inverted internal chip-select signal $\overline{CS}$ to an input circuit IPC, which is the same as the circuit illustrated in FIG. 3.

The chip-select control circuit comprises three inverter circuits $IV_1$, $IV_2$, and $IV_3$. The first inverter circuit $IV_1$ comprises a P-channel transistor Q19, a P-channel transistor Q20, and an N-channel transistor Q21 which are serially connected between a power source $V_{CC}$ and ground. A first chip-select signal $\overline{CS}_1$ is applied to the gate of the transistor Q19 and a second chip-select signal $CS_2$ is applied to the gates of the transistors Q20 and Q21. The output of the first inverter $IV_1$ is derived from the junction of the transistors Q20 and Q21 and is supplied to the second inverter $IV_2$. In the embodiment of FIG. 7, the second inverter $IV_2$ is constructed as a two-input NOR logic gate circuit. A P-channel transistor Q23, a P-channel transistor Q24, and a parallel circuit comprising an N-channel transistor Q25 and an N-channel transistor Q26 are connected in series between the power source $V_{CC}$ and ground. The output signal of the first inverter $IV_1$ is applied to the gates of the transistors Q23 and Q25. The first chip-select signal $\overline{CS}_1$ is applied to the gates of the transistors Q24 and Q26. The third inverter $IV_3$ comprises a P-channel transistor Q27 and an N-channel transistor Q28 which are connected in series between the power source $V_{CC}$ and ground. The gates of the transistors Q27 and Q28 receive the output of the second inverter $IV_2$, i.e., an internal chip-select signal CS. An inverted internal chip-select control signal $\overline{CS}$ is derived from the junction of the transistors Q27 and Q28 and is supplied to the input circuit IPC.

Figure 8A:
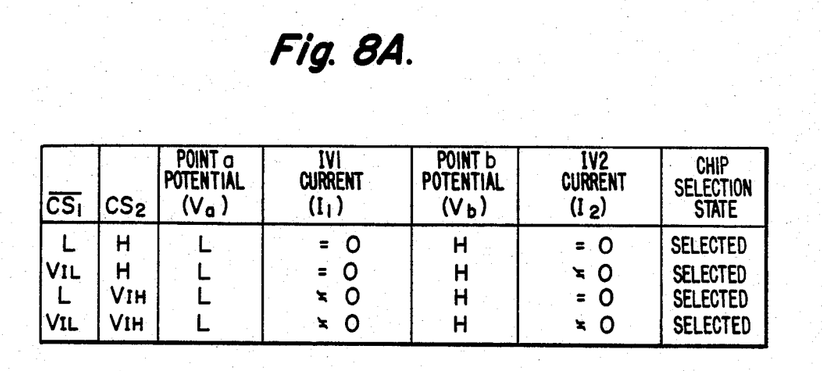
FIGS. 8A and 8B are diagrams illustrating the operation of the circuit of FIG. 7.
Figure 8B:
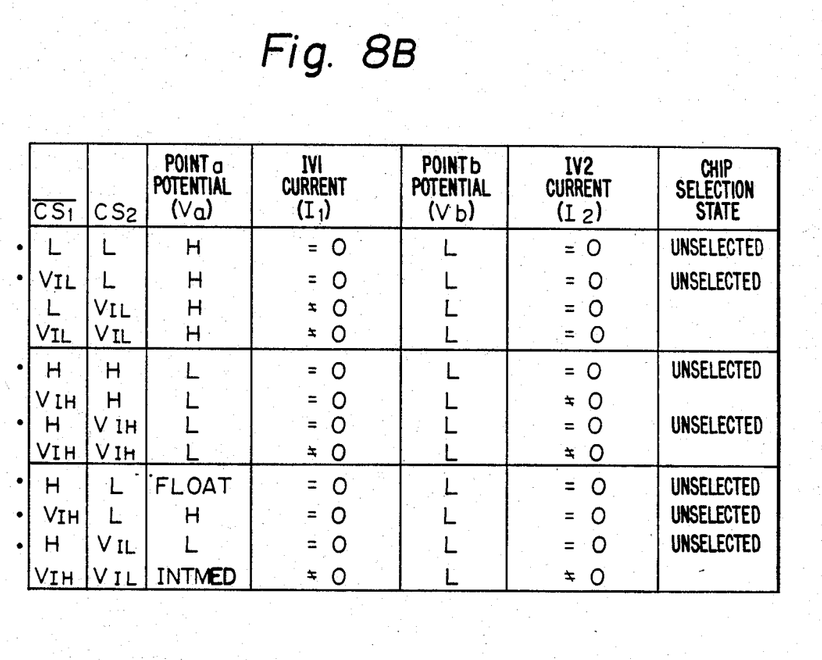

FIG. 8 is a table of levels in the circuit of FIG. 7 for various levels of the two chip-select signals $\overline{CS}_1$ and $CS_2$. The operation of the circuit illustrated in FIG. 7 is described with reference to FIG. 8. In FIG. 8, L denotes a voltage near zero volts, i.e., a voltage within the region A illustrated in FIG. 2, and H denotes a voltage near the power source voltage $V_{CC}$, i.e., a voltage within the region B illustrated in FIG. 2. $V_{IL}$ and $V_{IH}$ are, respectively, the same as those illustrated in FIG. 2. For example, $V_{IL}$ is 0.8 volts and $V_{IH}$ is 2.0 to 2.4 volts. In order to attain a chip-selected state in the circuit illustrated in FIG. 7, the chip-select signal $\overline{CS}_1$ must be at a low level, i.e., L or $V_{IL}$, and, at the same time, the chip-select signal $CS_2$ must be at a high level, i.e., H or $V_{IH}$. With there levels for $\overline{CS}_1$ and $CS_2$, the transistors Q19 and Q21 of the first inverter $IV_1$ turn on and the transistor Q20 turns off so that the potential at point a is an L level. Accordingly, the transistor Q23 in the second inverter $IV_2$ turns on and the transistor Q25 turns off. The transistor Q24 is in a turned-on state and the transistor Q26 is in a turned-off state, thus the level of the output of the second inverter $IV_2$, i.e., the level at point b, is an H level. Therefore, the output $\overline{CS}$ of the third inverter $IV_3$ assumes a low level. In the input circuit IPC, a transistor Q5 turns on and a transistor Q8 turns off. Therefore, the input circuit IPC functions as an ordinary CMIS inverter and a chip-selected state is attained.

When the chip-select signals $\overline{CS}_1$ and $CS_2$ are not in the above-mentioned states (e.g., L and H, respectively), the inverted chip-select signal $\overline{CS}$ assumes the H level and a chip-unselected state is attained. For example, when both of the chip-select signals $\overline{CS}_1$ and $CS_2$ are at a low level, i.e., at an L or $V_{IL}$ level, both of the transistors Q19 and Q20 in the first inverter $IV_1$ turn on and the level at point a is an H level. As a result, the transistor Q25 in the second inverter $IV_2$ turns on and the level at point b is an L level. Therefore, the inverted chip-select signal $\overline{CS}$ assumes an H level so that the transistor Q5 in the input circuit IPC turns off and the transistor Q8 turns on. As a result, irrespective of the level of the input signal IN, the inverted input signal $\overline{IN}$ assumes a low level and a chip-unselected state is attained. If, in this case, the chip-select signals $CS_2$ is at an L level, the transistor Q21 in the first inverter $IV_1$ is completely turned off so that no current flows through the first inverter $IV_1$. Since the level at point a is an H level, the transistor Q23 in the second inverter $IV_2$ is completely turned off and no current flows therethrough. In the third inverter $IV_3$, since the signal at point b, i.e., the club select signal CS, assumes an L level, the transistor Q28 is completely turned off so that no current flows therethrough.

When both chip-select signals $\overline{CS}_1$ and $CS_2$ are at a high level, i.e., H or $V_{IH}$, the transistor Q21 in the first inverter $IV_1$ turns on and the level at point a is an L level. Since the transistor Q26 in the second inverter $IV_2$ turns on, the level at point b also is an L level. As a result, the inverted chip-select signal $\overline{CS}$ assumes an H level and a chip-unselected state is attained. If, in this case, the chip-select signal $\overline{CS}_1$ is at an H level, both the transistor Q19 in the first inverter $IV_1$ and the transistor Q24 in the second inverter $IV_2$ are completely turned off and no current flows through the first and second inverters.

Next, a case where the chip-select signal $\overline{CS}_1$ is at a high level, i.e., H or $V_{IH}$, and the chip-select signal $CS_2$ is at a low level, i.e., L or $V_{IL}$, is considered. If the chip-select signal $\overline{CS}_1$ is at an H level and the chip-select signal $CS_2$ is at an L level, both of the transistors Q19 and Q21 in the first inverter $IV_1$ are completely turned off. Thereof, no current flows through the first inverter $IV_1$ and the output terminal thereof, i.e., point a assumes a floating state. In the second inverter $IV_2$, the transistor Q26 turns on and the transistor Q24 is completely turned off. Therefore, the level at point b is an L level and no current flows through the second inverter $IV_2$. When the chip-select signal $\overline{CS}_1$ is at $V_{IH}$ and the chip-select signal $CS_2$ is L, the transistor Q21 in the first inverter $IV_1$ is at completely turned off. At this time, the transistor Q20 turns on and the transistor Q19 is in a slightly conductive state. As a result, the level at point a is an H level, and no current is flowing through the first inverter $IV_1$. Since, in this case, the transistor Q25 in the second inverter $IV_2$ is turned on, point b assumes an L level and no current flows through the second inverter $IV_2$ because the transistor Q23 is completely turned off. If the chip-select signal $\overline{CS}_1$ is H and the chip-select signal $CS_2$ is $V_{IL}$, the transistor Q19 in the first inverter $IV_1$ turns off, the transistor Q20 turns on, and the transistor Q21 assumes a somewhat conductive state. Therefore, point a assumes an L level, and no current is flowing through the inverter $IV_1$. In this case, the transistor Q26 in the second inverter $IV_2$ turns on and the transistor Q24 turns off. Accordingly, point b assumes an L level and no current flows through the second inverter $IV_2$. When the chip-select signal $\overline{CS}_1$ is $V_{IH}$ and the chip-select signal $CS_2$ is $V_{IL}$, the transistor Q19 in the first inverter $IV_1$ assumes a somewhat conductive state, the transistor Q20 turns on, and the transistor Q21 assumes a somewhat conductive state. Therefore, point a assumes an intermediate value between the power source voltage $V_{CC}$ and 0 volts. The current flowing through the first inverter $IV_1$ does not assume a zero value. Since, in this case, the transistor Q26 in the second inverter $IV_2$ is turned on, point b assumes an L level. However, the current flowing through the second inverter $IV_2$ is not reduced to zero.

As is evident from the foregoing description, it is possible to attain a chip-unselected state in the circuit illustrated in FIG. 7 by setting the chip-select signal $\overline{CS}_1$ at an H level or the chip-select signal $CS_2$ at an L level. AT the same time, it is possible to reduce the current of both the first and second inverters $IV_1$ and $IV_2$ to zero. In such conditions, i.e., the conditions indicated by "." in FIG. 8, point b has an L level. Therefore, it is apparent that the value of the current flowing through the third inverter $IV_3$ is zero, and a complete battery backup condition is attained. In the above-mentioned embodiment of FIG. 7, the second inverter $IV_2$ is constructed as a NOR gate circuit. That is, the NOR logic output of the inverted chip-select signal $\overline{CS}_1$ and the output signal of the first inverter $IV_1$ is used as the internal chip-select control signal CS.

Figure 9:
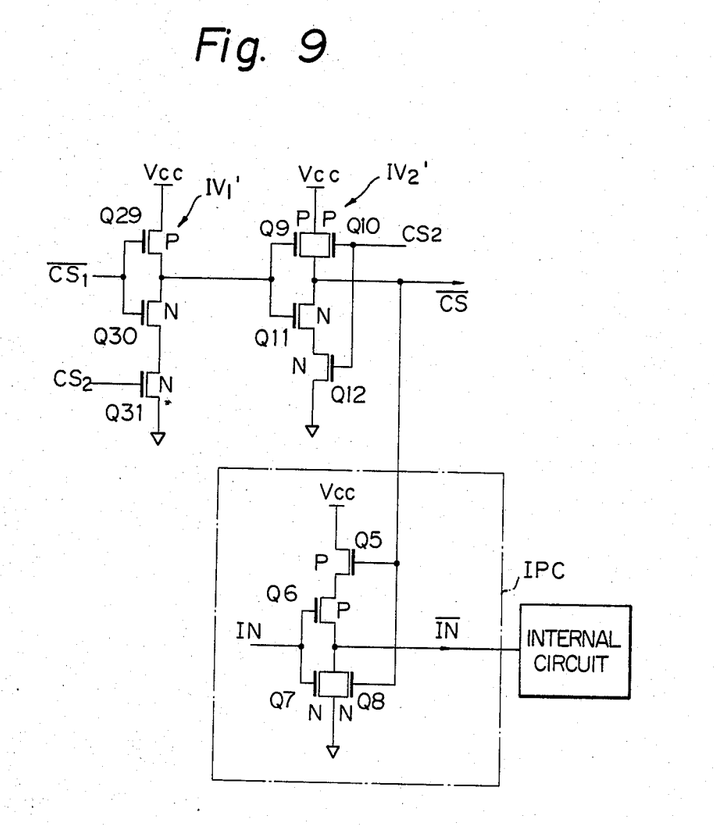
FIGS. 9 and 10 are partial electrical circuit diagrams illustrating CMIS circuit devices of other embodiments of the present invention.

As illustrated in FIG. 9, the NOR gate circuit $IV_2$ can be replaced with a NAND logic gate circuit $IV_2'$, to which the non-inverted chip-select signal $CS_2$ is applied. At this time, in accordance with the present invention, the inverted external chip-select signal $\overline{CS}_1$ is inverted in the first inverter. The output of the first inverter and the remaining chip-select signal $CS_2$ are input to the above-mentioned NAND gate circuit $IV_2'$ to produce the inverted internal chip-select signal $\overline{CS}$. The feature of FIG. 9 according to the present invention is that the remaining chip-select signal $CS_2$ is input to the gate of a transistor Q31 which is inserted between a power terminal of the first inverter and a power source (in this case ground). In the embodiment of FIG. 9, the transistor receiving the chip-select signal $CS_2$ may be an N-channel MIS transistor Q31 inserted into the first inverter $IV_1$ in series with the driver transistor thereof. When at least one of the chip-select signals indicates the chip-unselected state, the current in the circuits including the first inverter $IV_1$ can be made to be substantially zero no matter what level the remaining chip-select signal may assume. Thus, a complete battery backup condition can be realized.

Figure 10:
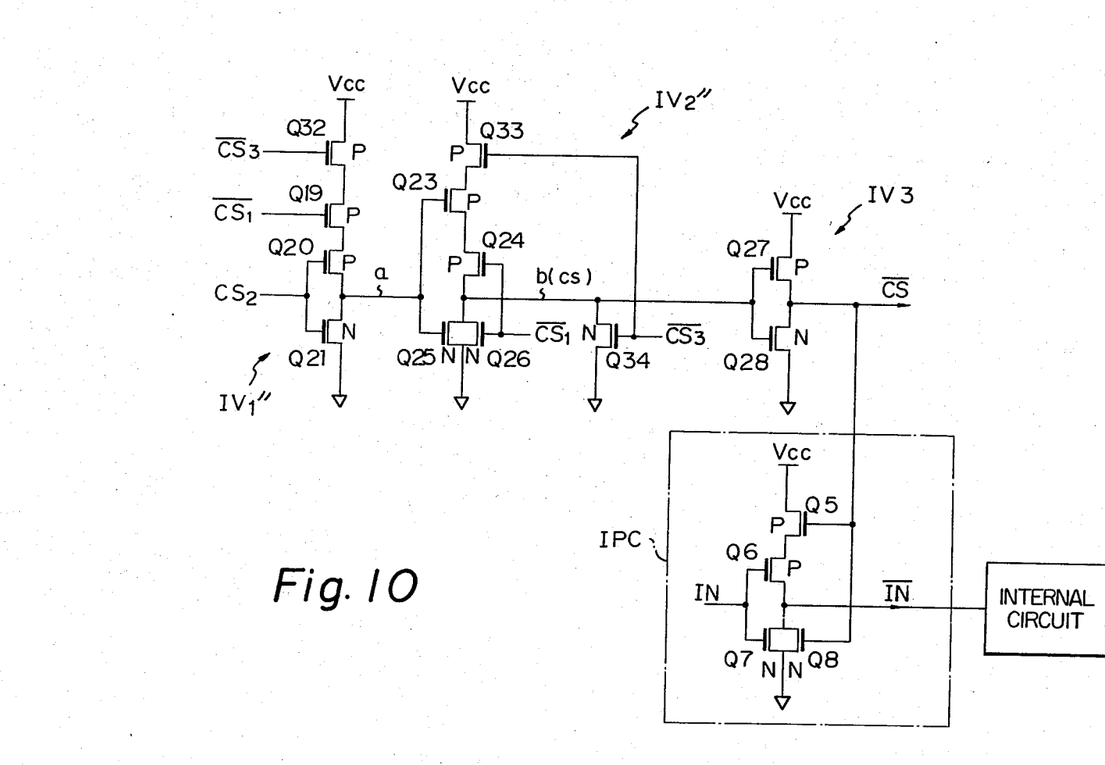

FIG. 10 illustrates another modified embodiment in which the CMIS circuit device is selected by three or more chip-select signals. In this case, the number of transistors Q19 and Q32 inserted into the first inverter $IV_1''$ is increased in accordance with the number of chip-select signals and the number of logic inputs applied to the second inverter (NOR gate $IV_2$ or NAND gate $IV_2'$) is also increased as in NOR gate $IV_2''$.

In accordance with the present invention, in a CMIS circuit device in which chip selection is effected by more than two chip-select signals having opposite polarities, it is possible to attain a chip-unselected state and to reduce the circuit current to zero by setting only one chip-select signal at the level of the power source or at the level of ground, thereby realizing a complete battery backup condition.

We claim:

1. A complementary metal-insulator semiconductor (CMIS) circuit device operatively connectable to a power source, having a level and supplying a current, to ground and to receive an external input signal, and selectable in dependence upon first and second chip-select signals, said CMIS circuit device comprising:

a chip-select control circuit, operatively connectable to the power source and to receive the first and second chip-select signals, for establishing the chip-selected state and a chip-unselected state upon receiving the first and second chip-select signals, said chip-select control circuit comprising;

CMIS inverter means, operatively connectable to the power source and to receive the first and second chip-select signals, for inverting the first chip-select signal and generating an output signal, said CMIS inverter means comprising:

a CMIS inverter, operatively connectable to receive the first chip-select signal and having a power terminal, for outputting the output signal of said CMIS inverter means; and a control transistor, having a gate operatively connected to receive the second chip-select signal, operatively connected to the power terminal of said CMIS inverter and connectable to the power source; and CMIS logic gate means, operatively connected to receive the output signal of said CMIS inverter means and the second chip-select signal, for generating an internal chip-select control signal;

an input circuit, operatively connected to said CMIS logic gate means and operatively connectable to the power source to receive the external input signal, for supplying an input signal, having a level near the level of one of the power source and ground, in dependence upon the internal chip-select control signal, the current supplied by said power source through said input circuit being cut off when the internal chip-select control signal indicates the chip-unselected state; and an internal circuit, operatively connected to said input circuit and operatively connectable to the power source and ground, for receiving the input signal when the internal chip-select control signal indicates the chip-selected state.

2. A CMIS circuit device of claim 1, wherein said CMIS logic gate means comprises a NOR gate operatively connected to said CMIS inverter and to receive the second chip-select signal.

3. A CMIS circuit device of claim 2, wherein said NOR gate comprises:

at least two series-connected transistors having a first conductivity type, one of said series-connected transistors operatively connectable to the power source and each of said series-connected transistors having a gate operatively connected to receive one of the output signal from said CMIS inverter and the second chip-select signal; and at least two parallel-connected transistors having a second conductivity type, operatively connected in series with said series-connected transistors and operatively connectable to the power source, each of said parallel connected transistors having a gate operatively connected to receive one of the output signal from said CMIS inverter and the second chip-select signal.

4. A CMIS circuit device of claim 2, wherein said control transistor has a conductivity type and said CMIS inverter comprises a transistor, operatively connected to said control transistor, having the conductivity type of said control transistor.

5. A CMIS circuit device of claim 1, wherein said CMIS logic gate means comprises a NAND gate operatively connected to receive the output signal from said CMIS inverter and the second chip-select signal.

6. A CMIS circuit device of claim 5, wherein said NAND gate comprises:
at least two parallel-connected transistors having a first conductivity type operatively connectable to the power source, each of said parallel-connected transistors having a gate operatively connected to receive one of the output signal from said CMIS inverter and the second chip-select signal; and
at least two series-connected transistors having a second conductivity type, operatively connected in series with said parallel-connected transistors, one of said series-connected transistors operatively connectable to the power source and each of said series-connected transistors having a gate operatively connected to receive one of the output signal from said CMIS inverter and the second chip-select signal.

7. A CMIS circuit device of claim 5, wherein said control transistor has a conductivity type and said CMIS inverter comprises a transistor, operatively connected to said control transistor, having the conductivity type of said control transistor.

8. A CMIS circuit device of claim 1,
further comprising an input terminal operatively connected to receive an external input signal, and
wherein said input circuit comprises:
a plurality of series-connected transistors having a first conductivity type, each of said series-connected transistors having a gate operatively connected to one of said CMIS logic gate means and said input terminal; and
a plurality of parallel-connected transistors having a second conductivity type, operatively connected in series with said series-connected transistors, each of said parallel-connected transistors having a gate operatively connected to one of said input terminal and said CMIS logic gate means.

9. A chip-select control circuit for a complementary metal-insulator semiconductor (CMIS) device operatively connected to a CMIS circuit in said CMIS device and operatively connectable to a power source and to receive first and second chip-select signals, the first chip-select signal indicating a chip-selected state with a first level and the second chip-select signal indicating the chip-selected state with a second level different from the first level, said chip-select control circuit comprising:
a CMIS inverter operatively connected to receive the first chip-select signal and generating an output;
a control transistor operatively connected to said CMIS inverter and connectable to the power supply and to receive the second chip-select signal;
CMIS logic gate means opertively connected to said CMIS inverter and to receive the second chip-select signal, for generating a chip-select control signal indicating chip-selected and chip-unselected states in dependence upon the output of said CMIS inverter and the second chip-select control signal; and
power supply means, operatively connected to said CMIS logic gate means and the power source, for supplying power to the CMIS circuit when the chip-select control signal indicates the chip-selected state and for cutting off power when the chip-select control signal indicates the chip-unselected state.

10. A circuit as recited in claim 9, wherein the power source has first and second power source terminals and said CMIS logic gate means comprises:
a first transistor operatively connectable to the first power source terminal and to receive the output signal of said CMIS inverter and having a first conductivity type;
a second transistor, operatively connected in series with said first transistor and to said power supply means and operatively connectable to receive the second chip-select signal, having the first conductivity type;
a third transistor, operatively connected to said second transistor, said CMIS inverter and said power supply means and operatively connectable to the second power source terminal, receiving the output of said CMIS inverter and having a second conductivity type; and
a fourth transistor having the second conductivity type, operatively connected in parallel with said third transistor to the second power source terminal, said second transistor and said power supply means and operatively connectable to receive the second chip-select signal, the chip-select control signal being output at a junction of said second, third and fourth transistors.

11. A circuit as recited in claim 10, wherein said first conductivity type is a P-conductivity type, said second conductivity type is an N-conductivity type, said first power source terminal has a positive voltage and said second power source terminal is ground.

12. A circuit as recited in claim 10, wherein the first conductivity type is an N-conductivity type, the second conductivity type is a P-conductivity type, the first power source terminal is ground and the second power source terminal has a positive voltage.

13. A circuit as recited in claim 10, wherein said CMIS circuit device receives a third chip-select signal, wherein said CMIS logic gate means further comprises:
a fifth transistor operatively connected to said first transistor and connectable to the first power source terminal and to receive the third chip-select signal and having the first conductivity type; and
a sixth transistor, operatively connected in parallel with said third and fourth transistors to said second transistor, said power supply means and the second power source terminal and operatively connectable to receive the third chip-select signal, having the second conductivity type, and further comprising another control transistor operatively connected in series with said control transistor and operatively connectable to the power source and to receive the third chip-select signal.

* * * * *

UNITED STATES PATENT AND TRADEMARK OFFICE
CERTIFICATE OF CORRECTION

PATENT NO. : 4,581,549
DATED : April 8, 1986
INVENTOR(S) : Aoyama et al.

It is certified that error appears in the above-identified patent and that said Letters Patent is hereby corrected as shown below:

Column 1, line 52, delete line in its entirety;
line 53, delete "chip-select signal"; after "voltage" insert --, whichever voltage signifies the unselected state for that chip-selected signal--.

Column 2, line 35, " $|V_{th}|$ " should be -- $|V_{th}(P)|$ --.

Column 3, line 5, "on" should be --one--.
Column 5, line 5, delete "in" (first occurrence).
Column 6, line 2, "there" should be --these--;
line 38, "club" should be --chip--.
Column 7, line 32, "AT" should be --At--.

Signed and Sealed this

Sixteenth Day of September 1986

[SEAL]

Attest:

DONALD J. QUIGG

Attesting Officer

Commissioner of Patents and Trademarks